United States Patent
Hsieh et al.

(10) Patent No.: US 10,802,405 B2
(45) Date of Patent: Oct. 13, 2020

(54) RADIATION SOURCE FOR LITHOGRAPHY EXPOSURE PROCESS

(71) Applicant: Taiwan Semiconductor Manufacturing Co., Ltd., Hsinchu (TW)

(72) Inventors: Chieh Hsieh, Taoyuan (TW); Shang-Chieh Chien, New Taipei (TW); Li-Jui Chen, Hsinchu (TW); Po-Chung Cheng, Zhongpu Shiang (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 73 days.

(21) Appl. No.: 16/124,357

(22) Filed: Sep. 7, 2018

(65) Prior Publication Data

US 2020/0033732 A1    Jan. 30, 2020

Related U.S. Application Data

(60) Provisional application No. 62/703,942, filed on Jul. 27, 2018.

(51) Int. Cl.
   *G03B 27/54*   (2006.01)
   *G03F 7/20*    (2006.01)
   *H05G 2/00*    (2006.01)

(52) U.S. Cl.
   CPC ...... *G03F 7/70033* (2013.01); *G03F 7/70041* (2013.01); *G03F 7/7085* (2013.01);
   (Continued)

(58) Field of Classification Search
   CPC .......... H05G 2/00; H05G 2/001; H05G 2/003; H05G 2/008; H05G 2/006; G03F 7/70033; G03F 7/70491; G03F 7/70641; G03F 7/70008; G03F 7/70025; G03F 7/70041; G03F 7/70916; G03F 7/70941; G03F 7/70175; G03F 7/7085; G03F 7/70925;
   (Continued)

(56) References Cited

U.S. PATENT DOCUMENTS 8,764,995 B2   7/2014  Chang et al.
8,796,666 B1   8/2014  Huang et al.
(Continued)

OTHER PUBLICATIONS

U.S. Appl. No. 15/868,373, filed Jan. 11, 2018.
(Continued)

*Primary Examiner* — Christina A Riddle
(74) *Attorney, Agent, or Firm* — McClure, Qualey & Rodack, LLP

(57) ABSTRACT

A method for generating EUV radiation is provided. The method includes generating a target droplet with a target droplet generator. The method further includes recording an image of the target droplet on a first image plane to detect a first position of the target droplet. The method also includes recording an image of the target droplet on a second image plane to detect a second position of the target droplet. In addition, the method includes projecting a laser pulse onto the target droplet when the target droplet is located on a focus plane. The method further includes adjusting at least one parameter of the target droplet generator according to the first position and the second position.

20 Claims, 5 Drawing Sheets

(52) U.S. Cl.
CPC ...... *G03F 7/70141* (2013.01); *G03F 7/70491* (2013.01); *H05G 2/006* (2013.01)

(58) Field of Classification Search
CPC .. G03F 7/706; G03F 7/70141; G03F 7/70558; G03F 7/7055; G03F 7/70525
USPC .............. 355/52, 53, 55, 67–71, 77, 30; 356/399–400, 318, 72; 378/34; 313/231.31–231.61; 315/111.21; 250/492.1, 492.2, 492.23, 493.1, 503.1, 250/504 R, 505.1
See application file for complete search history.

(56) References Cited

U.S. PATENT DOCUMENTS

| | | | |
|---|---|---|---|
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 2004/0105095 | A1* | 6/2004 | Stobrawa ............... H05G 2/003 356/318 |
| 2005/0178979 | A1* | 8/2005 | Masaki ............... G03F 7/70916 250/492.1 |
| 2010/0294958 | A1* | 11/2010 | Hayashi ............... H05G 2/006 250/504 R |
| 2012/0248344 | A1* | 10/2012 | Wakabayashi ......... H05G 2/005 250/504 R |
| 2015/0083936 | A1* | 3/2015 | Wehrens ............... H05G 2/006 250/504 R |
| 2015/0102239 | A1 | 4/2015 | Yanagida et al. |
| 2015/0294744 | A1 | 10/2015 | Sekine et al. |
| 2016/0037616 | A1* | 2/2016 | Saito ...................... H05G 2/005 250/504 R |
| 2016/0234920 | A1* | 8/2016 | Suzuki ................. H05G 2/008 |
| 2017/0064799 | A1 | 3/2017 | Yabu et al. |
| 2019/0150265 | A1* | 5/2019 | Hsieh .................... H05G 2/005 250/504 R |

OTHER PUBLICATIONS

Non-Final Office Action dated Oct. 5, 2018, issued in U.S. Appl. No. 15/868,373.

Final Office Action dated Apr. 3, 2019, issued in U.S. Appl. No. 15/868,373.

* cited by examiner

RADIATION SOURCE FOR LITHOGRAPHY EXPOSURE PROCESS

PRIORITY CLAIM AND CROSS-REFERENCE

This application claims the benefit of U.S. Provisional Application No. 62/703,942, filed on Jul. 27, 2018, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1-100 nm. One type of EUV light source is laser-produced plasma (LPP). LPP technology produces EUV light by focusing a high-power laser beam onto small fuel droplet target droplets to form highly ionized plasma that emits EUV radiation with a peak of maximum emission at 13.5 nm. The EUV light is then collected by a collector and reflected by optics towards a lithography exposure object, e.g., a wafer.

Although existing methods and devices for generating EUV light have been adequate for their intended purposes, they have not been entirely satisfactory in all respects. Consequently, it would be desirable to provide a solution for increasing power conversion efficiency from the input energy for ionization.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
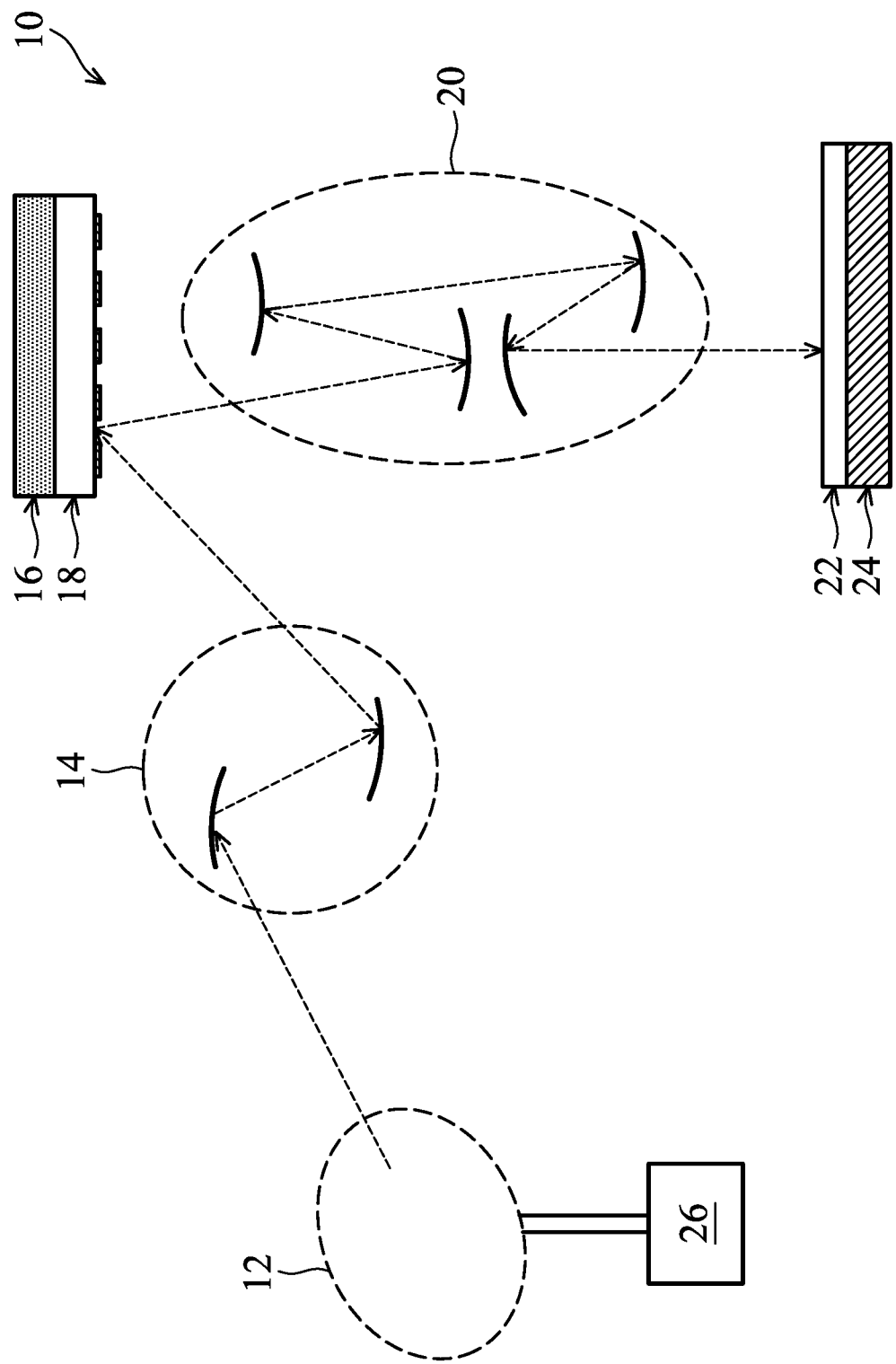
FIG. 1 shows a schematic view of a lithography system with a radiation source module, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The present disclosure is generally related to extreme ultraviolet (EUV) lithography systems and methods. More particularly, it is related to apparatus and methods for improving efficiency in laser produced plasma (LPP) EUV radiation sources and mitigating contamination on LPP collectors in the LPP EUV radiation sources. One challenge in existing EUV lithography systems is the low efficiency of generating EUV radiation, which directly impacts wafer throughput. An object of the present disclosure is to optimize parameters of LPP EUV radiation sources so as to improve their EUV conversion efficiency. Another challenge is the degradation of LPP collectors or EUV collectors. An LPP collector collects and reflects EUV radiation and contributes to overall EUV conversion efficiency. However, it is subject to damage and degradation due to debris deposition and the impact of particles, ions, and radiation. Accordingly, another object of the present disclosure is directed at reducing debris deposition onto LPP collectors, thereby increasing their usable lifetime.

FIG. 1 is a schematic and diagrammatic view of a lithography system 10, in accordance with some embodiments. The lithography system 10 may also be generically referred to as a scanner that is operable to perform lithography exposing processes with respective radiation source and exposure mode.

The lithography system 10 includes a radiation source module 12, an illuminator 14, a mask stage 16, a mask 18, a projection optics module (or projection optics box (POB)) 20 and a wafer stage 24, in accordance with some embodiments. The elements of the lithography system 10 can be added to or omitted, and the invention should not be limited by the embodiment.

The radiation source module 12 is configured to generate radians having a wavelength ranging between about 1 nm and about 100 nm. In one particular example, the radiation source module 12 generates an EUV light with a wavelength centered at about 13.5 nm. Accordingly, the radiation source module 12 is also referred to as an EUV light source. However, it should be appreciated that the radiation source module 12 should not be limited to emitting EUV light. The radiation source module 12 can be utilized to perform any high-intensity photon emission from excited target material.

In various embodiments, the illuminator 14 includes various optical modules, such as a single lens or a lens system having multiple lenses (zone plates) or alternatively reflective optics (for EUV lithography system), such as a single mirror or a mirror system having multiple mirrors in order to direct light from the radiation source module 12 onto a mask stage 16, particularly to a mask 18 secured on the mask stage 16. In the present embodiment where the radiation source module 12 generates light in the EUV wavelength range, reflective optics is employed.

The mask stage 16 is configured to secure the mask 18. In some embodiments, the mask stage 16 includes an electrostatic chuck (e-chuck) to secure the mask 18. This is because the gas molecules absorb EUV light and the lithography system for the EUV lithography patterning is maintained in a vacuum environment to avoid EUV intensity loss. In the present disclosure, the terms mask, photomask, and reticle are used interchangeably.

In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes reflective multilayer deposited on the substrate.

The reflective multilayer includes a plurality of film pairs, such as molybdenum-silicon (Mo/Si) film pairs (e.g., a layer of molybdenum above or below a layer of silicon in each film pair). Alternatively, the reflective multilayer may include molybdenum-beryllium (Mo/Be) film pairs, or other suitable materials that are configurable to highly reflect the EUV light. The mask 18 may further include a capping layer, such as ruthenium (Ru), disposed on the reflective multilayer for protection. The mask 18 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming an EUV phase shift mask.

The projection optics module (or projection optics box (POB)) 20 is configured for imaging the pattern of the mask 18 on to a semiconductor wafer 22 secured on a wafer stage 24 of the lithography system 10. In some embodiments, the POB 20 has refractive optics (such as for a UV lithography system) or alternatively reflective optics (such as for an EUV lithography system) in various embodiments. The light directed from the mask 18, carrying the image of the pattern defined on the mask, is collected by the POB 20. The illuminator 14 and the POB 20 are collectively referred to as an optical module of the lithography system 10.

In the present embodiment, the semiconductor wafer 22 may be made of silicon or another semiconductor material. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV light in the present embodiment. Various components including those described above are integrated together and are operable to perform lithography exposing processes.

The lithography system 10 may further include other modules or be integrated with (or be coupled with) other modules. In the present embodiment, the lithography system 10 includes a gas supply module 26 designed to provide hydrogen gas to the radiation source module 12. The hydrogen gas helps reduce contamination in the radiation source module 12.

Figure 2:
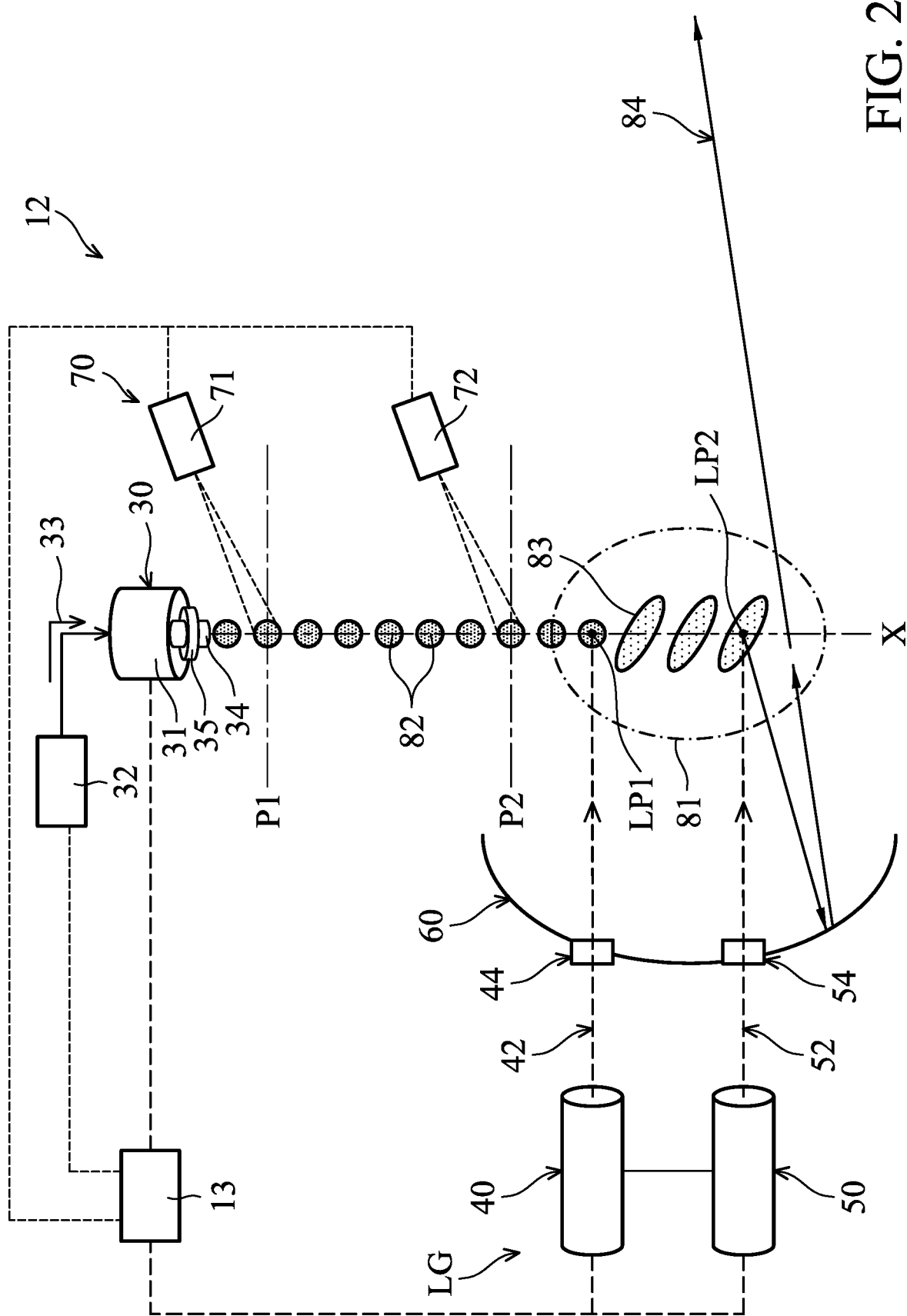
FIG. 2 is a diagrammatic view of the radiation source module in the lithography system of FIG. 1, in accordance with some embodiments.

FIG. 2 illustrates the radiation source module 12 in a diagrammatical view, in accordance with some embodiments. The radiation source module 12 employs a dual-pulse laser produced plasma (LPP) mechanism to generate plasma and further generate EUV light from the plasma.

In some embodiments, the radiation source module 12 includes a controller 13, a target droplet generator 30, a laser generator LG, a laser produced plasma (LPP) collector 60 and a monitoring device 70. The above-mentioned elements of the radiation source module 12 may be held under vacuum. It should be appreciated that the elements of the radiation source module 12 can be added to or omitted, and the invention should not be limited by the embodiment.

The target droplet generator 30 is configured to generate a number of target droplets 82. In some embodiments, the target droplet generator 30 includes a vessel 31 for containing a target material (not shown in figures) and a gas supplier 32. The gas supplier 32 is connected to the vessel 31 and configured to supply a pumping gas 33 into the vessel 31. The pumping gas 33 increases the pressure in vessel 31 so as to force target material contained in the vessel 31 out of the target droplet generator 30 and drive the flowing of the target droplets 82.

In some embodiments, the flow velocity of the target droplets 82 from the target droplet generator 30 is a function of the pressure of the pumping gas 33 in the target droplet generator 30. For example, the target droplets 82 flow faster when the pressure of the pumping gas 33 in the vessel 31 is increased, and the target droplets 82 flow slower when the pressure of the pumping gas 33 in the vessel 31 is reduced.

In some embodiments, the target droplet generator 30 further includes a nozzle 34 and an actuator 35. The nozzle 34 is connected to the vessel 31 for dispensing the target droplets 82, and the actuator 35 surrounds the nozzle 34. The actuator 35, for example, includes one or more step motors to control the position of the nozzle 34 in different directions, such as y-axis direction and/or z-axis direction. In some embodiments, the controller 13 supplies control signals to the actuator 35, and the actuator 35 drives the movement of the nozzle 34 in the y-axis direction and/or z-axis direction according to the control signal. As a result, a trajectory along which the target droplets 82 supplied by the nozzle 34 travels can be optimized, and the energy conversion efficiency of the EUV radiation can be improved.

In an embodiment, the target droplets 82 are tin (Sn) droplets. In an embodiment, the target droplets 82 each have a diameter about 30 microns (μm). In an embodiment, the target droplets 82 are generated at a rate about 50 kilohertz (kHz) and are introduced into a zone of excitation 81 in the radiation source module 12 at a speed about 70 meters per second (m/s). Other material can also be used for the target droplets 82, for example, a tin containing liquid material such as eutectic alloy containing tin, lithium (Li), and xenon (Xe). The target droplets 82 may be in a solid or liquid phase.

The laser generator LG is configured to generate at least one laser to allow a conversion of the target droplets 82 into plasma. In some embodiments, the laser generator LG includes a first laser source 40 and a second laser source 50. The first laser source 40 is configured to produce a first laser pulse 42. The second laser source 50 is configured to produce a second laser pulse 52. The first laser pulse 42 is used to heat (or pre-heat) the target droplets 82 to expand the target droplets 82, which is subsequently irradiated by the second laser pulse 52, generating increased emission of light.

In an embodiment, the first laser source 40 is a carbon dioxide ($CO_2$) laser source. In another embodiment, the first laser source 40 is a neodymium-doped yttrium aluminum garnet (Nd:YAG) laser source. In an embodiment, the second laser source 50 is a $CO_2$ laser source.

In the present embodiment, the first laser pulse 42 has less intensity and a smaller spot size than the second laser pulse 52. In various embodiments, the first laser pulse 42 has a spot size of about 100 μm or less, and the second laser pulse 52 has a spot size about 200-300 μm, such as 225 μm. The first laser pulse 42 and the second laser pulse 52 are generated to have certain driving powers to fulfill wafer volume production, such as a throughput of 125 wafers per hour. For example, the first laser pulse 42 is equipped with about 2 kilowatts (kW) driving power, and the second laser pulse 52 is equipped with about 19 kW driving power. In various embodiments, the total driving power of the first laser pulse 42 and the second laser pulse 52, is at least 20 kW, such as 27 kW. However, it should be appreciated that many variations and modifications can be made to embodiments of the disclosure.

The first laser pulse 42 and second laser pulse 52 are directed through windows (or lenses) 44 and 54, respectively, into the zone of excitation 81 and irradiate target droplets 82 at a first lighting position LP1 and a second lighting position LP2. The windows 44 and 54 adopt a suitable material substantially transparent to the respective laser beams. The method for exciting the target droplets 82 supplied by the target droplet generator 30 is described later.

The collector 60 is designed with proper coating material and shape, functioning as a mirror for EUV collection, reflection, and focus. In some embodiments, the collector 60 is designed to have an ellipsoidal geometry. In some embodiments, the coating material of the collector 60 is similar to the reflective multilayer of the mask 18. In some examples, the coating material of the collector 60 includes a ML (such as a plurality of Mo/Si film pairs) and may further include a capping layer (such as Ru) coated on the ML to substantially reflect the EUV radiation 84. In some embodiments, the collector 60 may further include a grating structure designed to effectively scatter the laser beams and laser pulses directed onto the collector 60. For example, a silicon nitride layer is coated on the collector 60 and is patterned to have a grating pattern. One consideration in the lithography system 10 (FIG. 1) is the usable lifetime of the collector 60. During the EUV generation processes, the reflective surface of the collector 60 is subjected to the impact of various particles, ions, and radiation. Over time, the reflectivity of the collector 60 degrades due to particle accumulation, ion damages, oxidation, blistering, etc. Among these, particle (e.g., tin debris) deposition is a dominant factor. The disclosed method and apparatus help reduce tin debris on the surface of the collector 60.

The monitoring device 70 is configured to monitor conditions of the target droplets 82 supplied by the target droplet generator 30. In some embodiments, the monitoring device 70 includes a number of cameras, such as first camera 71 and second camera 72. The first camera 71 and the second camera 72 are configured to monitor position of the droplets 82 in the y-z plane when the droplets 82 passes through a first image plane P1 and a second image plane P2, respectively.

Figure 3:
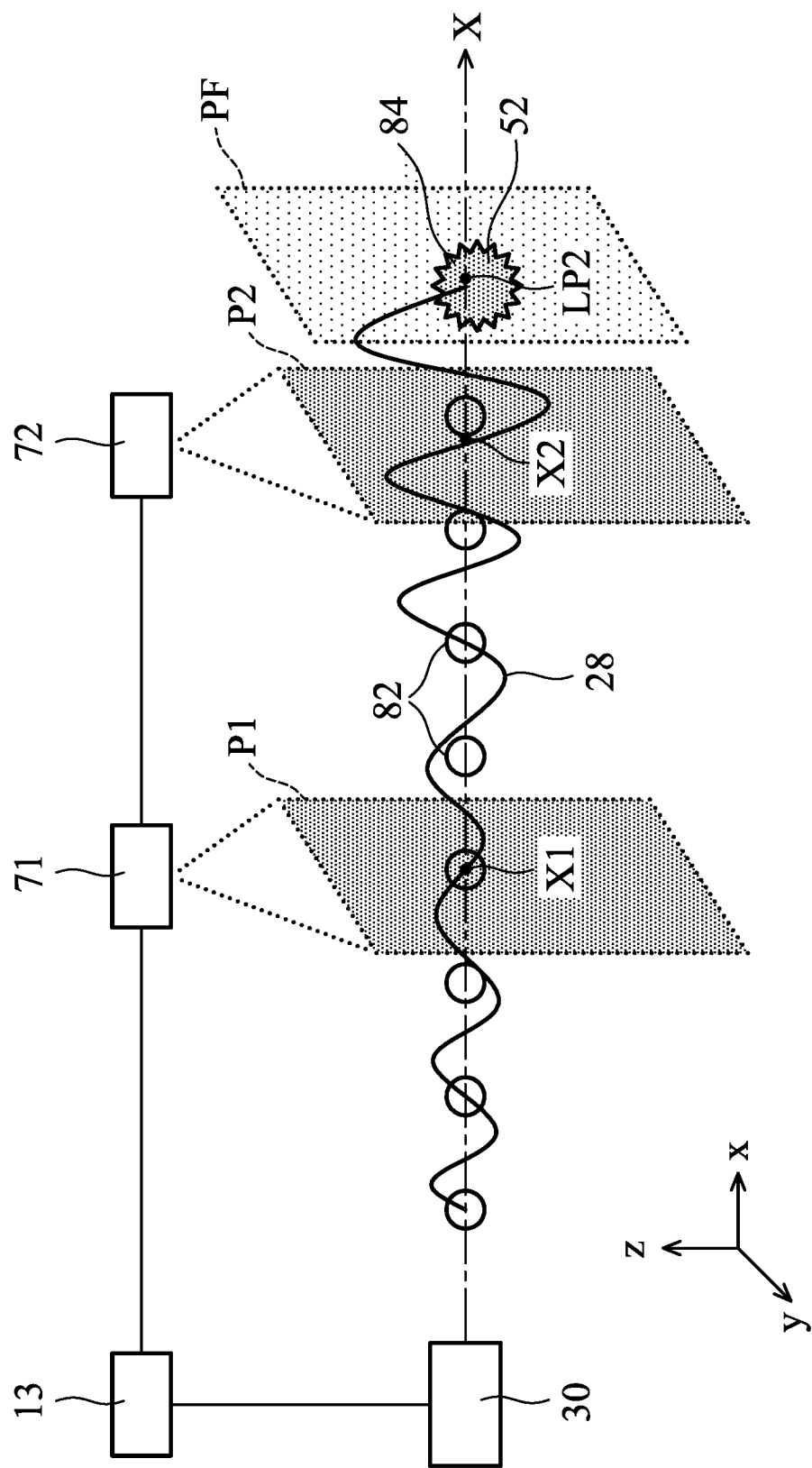
FIG. 3 is a diagrammatic view of partial elements of the radiation source module while target droplets are generated by a target droplet generator, in accordance with some embodiments.

In some embodiments, as shown in FIG. 3, the first image plane P1 is perpendicular to the x-axis and parallel with the y-z plane. The first image plane P1 intersects with the x-axis at position X1, the position X1 is located about 10 mm away from the second lighting position LP2. The second image plane P2 is perpendicular to the x-axis and parallel with the y-z plane. The second image plane P2 and intersects with the x-axis at position X2. In a certain embodiment, the position X2 is located between the first lighting position LP1 (FIG. 2) and the position X1, and the position X2 is located outside of the zone of excitation 81. The x-axis may pass through the target droplet generator 30 and the first lighting position LP1 and the second lighting position LP2.

In some embodiments, the first camera 71 and the second camera 72 are fine droplet steering cameras (FDSC). The first camera 71 and the second camera 72 are configured to record flashes from droplets 82 passing through the corresponding first image plane P1 or second image plane P2. For example, the first camera 71 is oriented to collect light from the flashes created when droplets 82 pass through the first image plane P1, while plasma light from the second image plane P2 or the zone of excitation 81 will not be collected in the same way since it is coming from a different direction than from first image plane P1.

Alternatively or additionally, light curtains (not shown) with different wavelengths may be illuminated toward the first image plane P1 and the second image plane P2. Image sensor (not shown) of the first camera 71 is configured to detect light that is projected on the corresponding first image plane P1, and not light at either the wavelength of the light projected on the second image plane P2 or the plasma light created at the zone of excitation 81. In addition, image sensor (not shown) of the second camera 72 is configured to detect light that is projected on the corresponding first image plane P2, and not light at either the wavelength of the light projected on the second image plane P1 or the plasma light created at the zone of excitation 81.

The orientation of the first camera 71 and the second camera 72 and the selection of the image sensor of the first camera 71 and the second camera 72 ensures that the first camera 71 and the second camera 721 accurately and reliably detects each flash created when the target droplets 82 passes through the corresponding first image plane P1 or second image plane P2.

Referring to FIG. 2, the controller 13 is configured to control one or more elements of the radiation source module 12. In some embodiments, the controller 13 is configured to drive the target droplet generator 30 to generate the target droplets 82. In addition, the controller 13 is configured to control the supply of pumping gas 33 from the gas supplier 32 into the target droplet generator 30 so as to change the flow velocity of the target droplets 82 from the target droplet generator 30. Moreover, the controller 13 is configured to control the actuator 35 of the target droplet generator 30 so as to change the position of the nozzle 34 and adjust the trajectory along which the target droplets 82 travels along to the zone of excitation 81.

In some embodiments, the controller 13 is also configured to drive the first laser source 40 and the second laser source 50 to fire the first laser pulse 42 and the second laser pulse 52. The generation of the first laser pulse 42 and the second laser pulse 52 may be controlled to be associated with the generation of target droplets 82 by the controller 13 so as to make the first laser pulse 42 and the second laser pulse 52 hit each target droplet 82 in sequence.

The controller 13 may be a computer system. In one example, the computer system includes a network communications device or a network computing device (for example, a mobile cellular phone, a laptop, a personal computer, a network server, etc.) capable of communicating with a network. In accordance with embodiments of the present disclosure, the computer system performs specific operations via a processor executing one or more sequences of one or more instructions contained in a system memory component.

The processor may include a digital signal processor (DSP), a microcontroller (MCU), and a central processing unit (CPU). The system memory component may include a random access memory (RAM) or another dynamic storage device or read only memory (ROM) or other static storage devices, for storing data and/or instructions to be executed by the processor. For example, the system memory component may store a predetermined value for the flow velocity of target droplets, a predetermined value for the period of time during an individual target passing two detection positions, or an acceptable range for adjusting the parameters of the laser generator.

Figure 4:
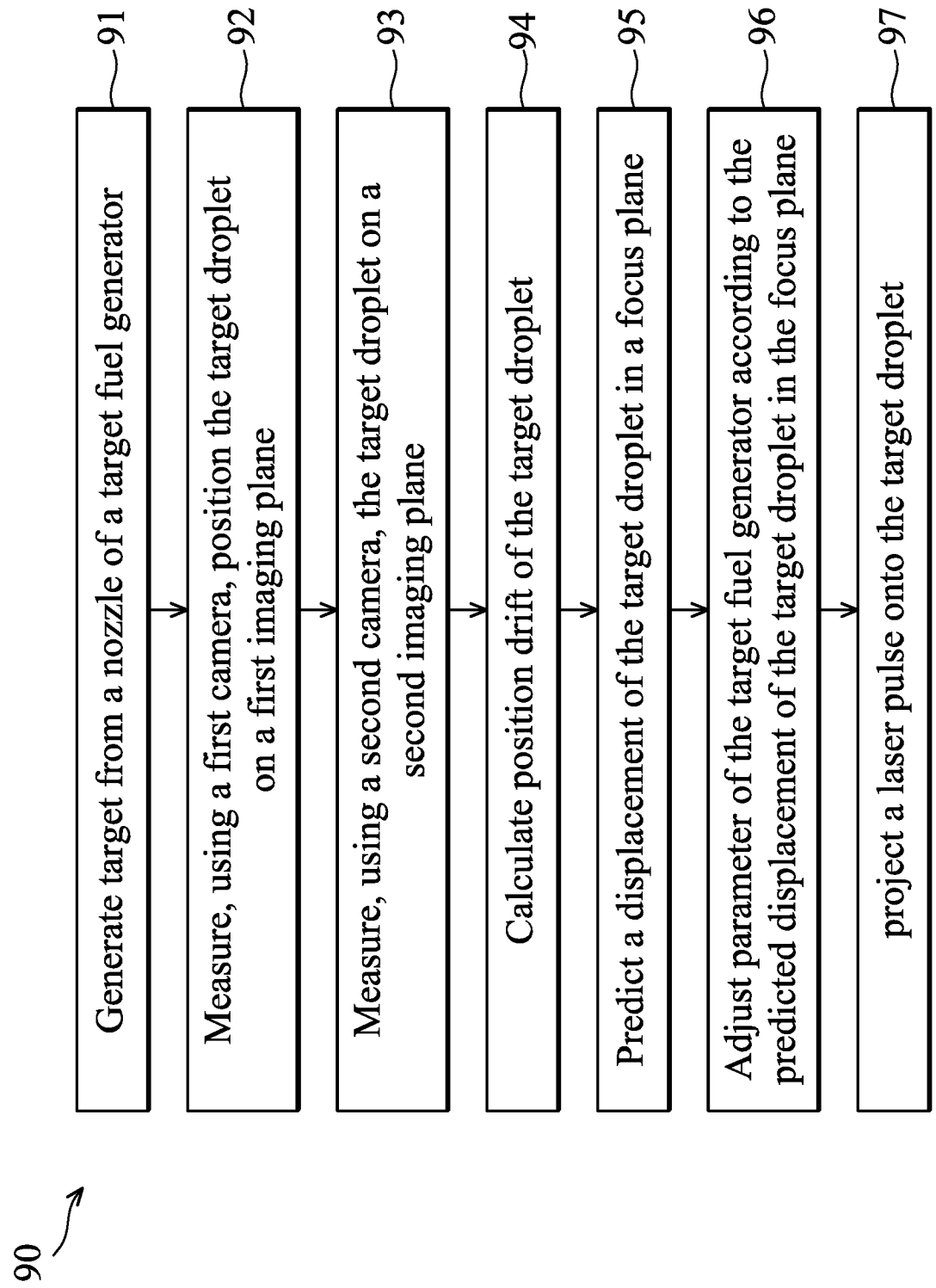
FIG. 4 is a flowchart of a method for a generating light, in accordance with some embodiments.

FIG. 4 is a flowchart of a method 90 for generating a light, in accordance with some embodiments. For illustration, the flow chart will be described along with the drawings shown in FIGS. 1-3 and 5. Some of the described transportation stages can be replaced or eliminated in different embodiments.

The method 90 includes operation 91, in which target droplets 82 are generated by forcing the target material out of the target droplet generator 30 via the nozzle 34. In some embodiments, the target droplet generator 30 shown in FIG. 2 is configured to generate the target droplets 82. The target droplet generator 30 is controlled to generate target droplets 82 with the proper material, proper size, proper frequency, and proper flow velocity and direction according to a processing recipe. After leaving the target droplet generator 30, the target droplets 82 sequentially passes through the first image plane P1, the second image plane P2, and the focus plane PF, as shown in FIG. 3.

The method 90 also includes operation 92 in which the position of one of the target droplets 82 at the first image plane P1 is measured. In some embodiments, the first camera 71 produces images of the target droplets 82 at the first image plane P1 and transmits the data associated with the images to the controller 13. The controller 13 may perform an image analysis to the images to determine the position of the target droplets at the first image plane P1. The analysis result may include the position of the target droplet 82 in the y-axis direction in the first image plane P1, and the position of the target droplet 82 in the z-axis direction in the first image plane P1. The position of the target droplet 82 may be an average of multiple measurements.

The method 90 also includes operation 93 in which the position of one of the target droplets 82 at the second image plane P2 is measured. In some embodiments, the first camera 71 produces images of the target droplets 82 at the second image plane P2 and transmits the data associated with the images to the controller 13. The controller 13 may perform an image analysis to the images to determine the position of the target droplets at the second image plane P2. The analysis result may include the position of the target droplet 82 in the y-axis direction in the second image plane P2, and the position of the target droplet 82 in the z-axis direction in the second image plane P2. The position of the target droplet 82 may be an average of multiple measurements.

Figure 5:
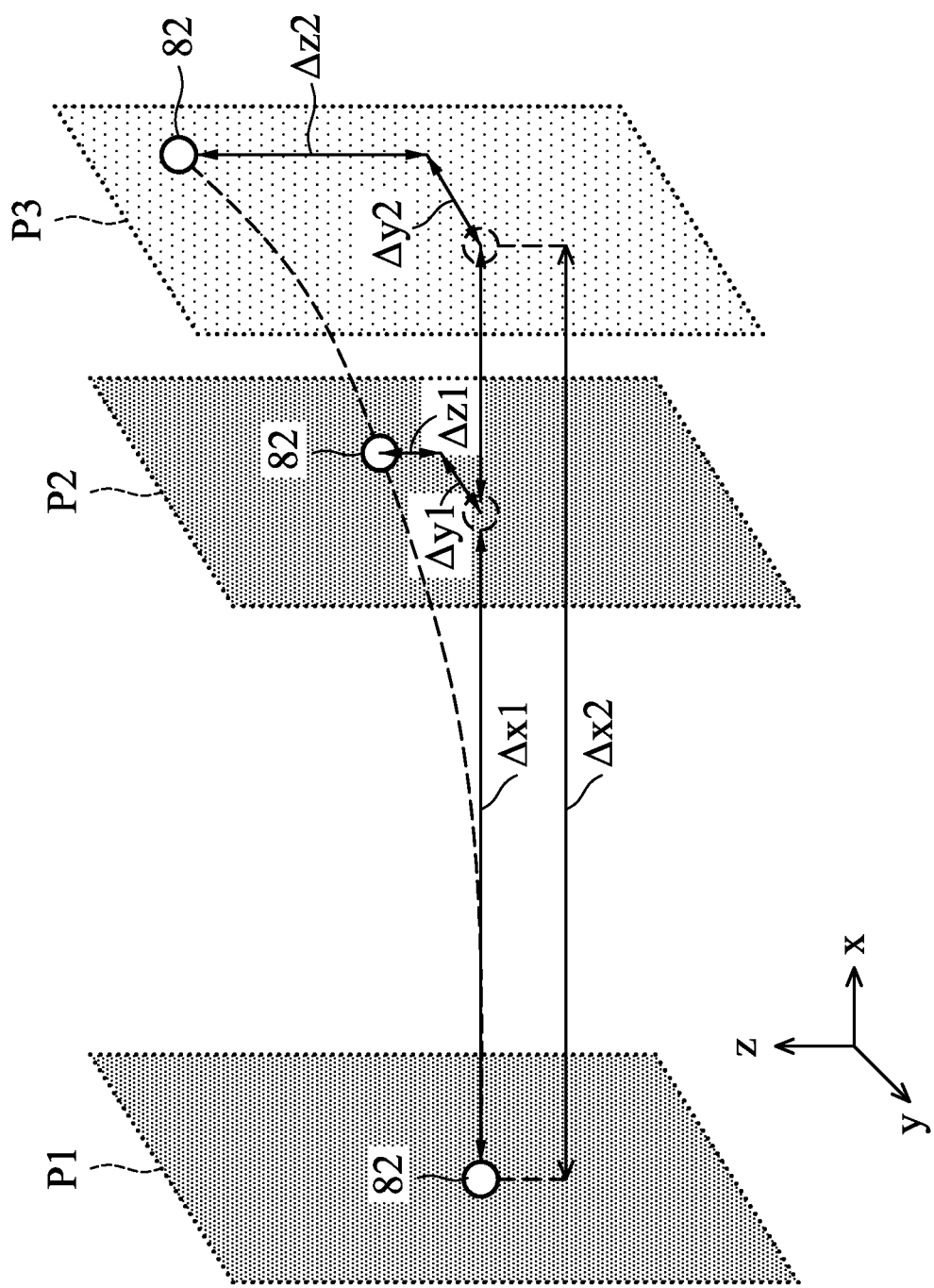
FIG. 5 is a diagrammatic view of a light source in the lithography system, in accordance with some embodiments.

In some embodiments, as shown in FIG. 5, the target droplets 82 are drifted from the x-axis, because the droplet position may be disturbed by vessel flow, such as flow from the gas supply module 26 or plasma shake wave 28 as the target droplets are approaching the zone of excitation 81. If the target droplets 82 travel along the drift trajectory, the target droplets 82 will not be completely heated by the second laser pulse 52, then not only will EUV conversion efficiency be lowered, but also excessive tin debris will be deposited on the collector 60.

To solve problems with the displacement of the target droplets, the method 90 continues to operations 94-96. In operation 94, the displacement of the target droplets 82 is calculated. In some embodiments, the displacement $\Delta y1$ of the target droplet 82 in the y-axis direction and the displacement $\Delta z1$ of the target droplet 82 in the z-axis direction at the first image plane P1 and the second image plane P2 are calculated. As shown in FIG. 5, the displacement $\Delta y1$ may be equal to the difference between the position of the target droplet 82 in the y-axis direction in the first image plane P1 and the position of the target droplet 82 in the y-axis direction in the second image plane P2. In addition, the displacement $\Delta z1$ may be equal to the difference between the position of the target droplet 82 in the z-axis direction in the first image plane P1 and the position of the target droplet 82 in the z-axis direction in the second image plane P2.

In some embodiments, the speed of the target droplets 82 in the y-axis direction and the z-axis direction are also calculated. The flow velocity Vy of the target droplets 82 in the y-axis direction may be calculated by dividing the calculated displacement $\Delta y1$ by the travel time of the target droplets 82 from the first image plane P1 to the second image plane P2. In addition, the flow velocity Vz of the target droplets 82 in the z-axis direction may be calculated by dividing the calculated displacement $\Delta z1$ by the travel time of the target droplets 82 from the first image plane P1 to the second image plane P2. The travel time can be calculated by dividing the flow velocity Vx of the target droplets in the x-axis by the distance $\Delta x1$ between the first image plane P1 and the second image plane P2. In a certain embodiment, the magnitude of the flow velocity Vx is about 70 m/s which is a function of the pressure of the pumping gas 33 supplied to the vessel 31.

In some embodiments, operation 94 is omitted. The trajectory along which the target droplets 82 travel is determined by the measured position of the target droplets in the first image plane P1 and the second image plane P2. The trajectory may be a linear distribution or a non-linear distribution, such as an exponential distribution.

In operation 95, the position of the target droplets 82 in the focus plane PF is predicted. In some embodiments, the focus plane PF is a plane in which the second lighting position LP2 (FIG. 2) is located. Alternatively, the focus plane PF is a plane in which the first lighting position LP1 (FIG. 2) is located. The focus plane PF may be perpendicular to the x-axis and parallel with the y-z plane.

In some embodiments, the displacement of the target droplets 82 in the focus plane PF is calculated according to the displacement calculated in operation 94. For example, as shown in FIG. 5, the displacement $\Delta y2$ of the target droplets 82 in the y-axis direction in the focus plane PF may satisfy the equation $\Delta x2/\Delta x1=\Delta y2/\Delta y1$, where $\Delta x2$ is the distance from the first image plane P1 to the focus plane PF. In addition, the displacement $\Delta z2$ of the target droplets 82 in the z-axis direction in the focus plane PF may satisfy the equation $\Delta x2/\Delta x1=\Delta z2/\Delta z1$.

However, it should be appreciated that many variations and modifications can be made to embodiments of the disclosure. In some other embodiments, the displacement of the target droplets 82 in the focus plane PF is calculated according to the trajectory along which the target droplets 82 travel.

In some other embodiments, the displacement of the target droplets 82 in the focus plane PF is calculated according to the speed of the target droplets 82 at the second image plane P2 in the y-axis direction and the z-axis direction are also calculated. For example, as shown in FIG. 5, the displacement $\Delta y2$ of the target droplets 82 in the y-axis direction in the focus plane PF may satisfy the equation $\Delta y2=Vy*T2$, where Vy is the flow velocity of the target droplets 82 in the y-axis direction, and T2 is the travel time of the target droplets from the first image plane P1 to the focus plane PF. In addition, the displacement $\Delta z2$ of the target droplets 82 in the z-axis direction in the focus plane PF may satisfy the equation $\Delta z2=Vz*T2$, where Vz is the flow velocity of the target droplets 82 in the z-axis direction. The travel time T2 can be calculated by dividing the flow velocity Vx of the target droplets 82 in the x-axis by the distance $\Delta x2$ between the first image plane P1 and the second image plane P2. In a certain embodiment, the magnitude of the flow velocity Vx is about 70 m/s.

In operation 96, at least one parameter of the target droplet generator 30 is adjusted according to the predicted displacement of the target droplets 82 in the focus plane PF. In some embodiments, operation 95 is performed by the controller 13, and the controller 13 outputs a control signal according to the predicted displacement of the target droplets 82 in the focus plane PF.

In one exemplary embodiment, the parameter includes the position of the nozzle 34 of the target droplet generator 30. The controller 13 may transmit a control signal to the actuator 35, and the actuator 35 drives the movement of the nozzle 34 in the y-axis direction and z-axis direction. The magnitude of the moving distance of the nozzle 34 in the y-axis direction may be equal to the magnitude of the predicted displacement $\Delta y2$, but the moving direction nozzle 34 is opposite to the direction of the predicted displacement $\Delta y2$. The magnitude of the moving distance of the nozzle 34 in the z-axis direction may be equal to the magnitude of the predicted displacement $\Delta z2$, but the moving direction nozzle 34 is opposite to the direction of the predicted displacement $\Delta z2$.

In another exemplary embodiment, the parameter includes flow velocity of the target droplets 82 in the x-axis direction. The controller 13 may transmit a control signal to the gas supplier 32 to raise the pressure in the vessel 31 so as to increase the flow velocity of the target droplets 82. With the increased velocity, the displacement of the target droplets in the focus plane PF can be mitigated or avoided.

In some embodiments, the method 90 also includes operation 97, in which at least one laser is projected onto the target droplets 82. In some embodiments, as shown in FIG. 2, after the adjustment of the parameter of the target droplet generator 30, the first laser pulse 42 is projected on the target droplets 82 at the first lighting position LP1 to extend the target droplets 82 with a pancake shape. Afterwards, the second laser pulse 52 projected on the target droplets 82 at the second lighting position LP2 to heat the target droplet 82 to produce plasma emitting EUV radiation. By optimizing one or more parameters of the target droplet generator 30, the target droplets 82 can be accurately irradiated with the second laser pulse 52, and higher power conversion can be achieved. In addition, contamination on the LPP collector 60 due to tin debris deposition is reduced.

Embodiments of the present disclosure can be implemented or integrated into existing EUV lithography systems. Embodiments of a method for generating light in lithography exposure process are provided. The parameters of the light source are adjusted according to collected information about the target droplets during the lithography exposure process. Therefore, light emission conversion efficiency is enhanced, and contamination of the light emitting system by debris is reduced.

According to some embodiments, a radiation source module is provided. The radiation source module includes a target droplet generator configured to generate a target droplet. The radiation source module further includes a first laser source and a second laser source. The first laser source is configured to generate a first laser pulse to extend the target droplet. The second laser source is configured to generate a second laser pulse that heats the target droplet to produce plasma emitting EUV radiation. The radiation source module also includes a first camera and a second camera. The first camera is configured to generate an image of the target droplet at a first image plane. The first image plane and the second image plane are arranged along the x-axis direction and located between the target droplet and the first laser source.

According to some embodiments, a lithography system is provided. The lithography system includes the above-mentioned radiation source module. The lithography system further includes a collector configured to collect and reflect the EUV radiation. The lithography system also includes a mask stage configured to secure a mask. In addition, the lithography system includes a wafer stage configured to secure a semiconductor wafer. The lithography system further includes one or more optical modules configured to direct the EUV radiation from the radiation source to image an integrated circuit (IC) pattern defined on the mask onto the semiconductor wafer.

According to some embodiments, a method for generating EUV radiation is provided. The method includes generating a target droplet with a target droplet generator. The method further includes recording an image of the target droplet on a first image plane to detect a first position of the target droplet. The method also includes recording an image of the target droplet on a second image plane to detect a second position of the target droplet. In addition, the method includes projecting a laser pulse onto the target droplet when the target droplet is located on a focus plane. The method further includes adjusting at least one parameter of the target droplet generator according to the first position and the second position.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A radiation source module, comprising:
a target droplet generator configured to generate a target droplet along an x-axis direction;
a first laser source configured to generate a first laser pulse to extend the target droplet;
a second laser source configured to generate a second laser pulse that heats the target droplet to produce plasma emitting EUV radiation;
a first camera configured to generate an image of the target droplet at a first image plane which is perpendicular to the x-axis direction and parallel to a y-z plane;
a second camera configured to generate an image of the target droplet at a second image plane which is perpendicular to the x-axis direction and parallel to the y-z plane, the second image plane being different from the first image plane, wherein the first image plane and the second image plane are arranged along the x-axis direction and located between the target droplet generator and the first laser source; and
a controller configured to:
determine a position of the target droplet at the first image plane based on the image captured by the first camera;
determine a position of the target droplet at the second image plane based on the image captured by the second camera; and
adjust at least one parameter of the target droplet generator based on a set of data, wherein the set of data comprises a difference between the position of the target droplet at the first image and the position of the target droplet at the second image.

2. The radiation source module of claim 1, wherein the set of data further comprises a flow velocity of the target droplet in the x-axis direction.

3. The radiation source module of claim 1, wherein the at least one parameter comprises a position where the target droplet generator supplies the target droplet.

4. The radiation source module of claim 1, where the at least one parameter comprises the flow velocity of the target droplet.

5. The radiation source module of claim 1, wherein the first image plane is located about 10 mm away from the second laser source.

6. The radiation source module of claim 1, wherein the first camera and the second camera are positioned on the same side of the x-axis direction.

7. The radiation source module of claim 1, wherein the first camera is configured to generate an image of the target droplet at a first time point, and the second camera is configured to generate an image of the target droplet at a second time point different from the first time point.

8. A lithography system, comprising:
a radiation source module, wherein the radiation source module comprises:
a target droplet generator configured to generate a target droplet along an x-axis direction;
a first laser source configured to generate a first laser pulse that extends the target droplet;
a second laser source configured to generate a second laser pulse that heats the target droplet to produce plasma emitting EUV radiation;
a first camera configured to generate a first image of the target droplet at a first image plane which is perpendicular to the x-axis direction and parallel to a y-z plane;
a second camera configured to generate a second image of the target droplet at a second image plane which is perpendicular to the x-axis direction and parallel to the y-z plane, the second image plane being different from the first image plane, wherein the first image plane and the second image plane are arranged along the x-axis direction and located between the target droplet generator and the first laser source; and
a controller configured to:
determine a position of the target droplet at the first image plane based on the image captured by the first camera;
determine a position of the target droplet at the second image plane based on the image captured by the second camera; and
adjust at least one parameter of the target droplet generator based on a set of data, wherein the set of data comprises a difference between the position of the target droplet at the first image and the position of the target droplet at the second image; and
a collector configured to collect and reflect the EUV radiation;
a mask stage configured to secure a mask;
a wafer stage configured to secure a semiconductor wafer; and
one or more optical modules configured to direct the EUV radiation from the radiation source module to image an integrated circuit (IC) pattern defined on the mask onto the semiconductor wafer.

9. The lithography system of claim 8, wherein the set of data further comprises a speed of the target droplet in the x-direction.

10. The lithography system of claim 8, wherein the at least one parameter comprises the position where the target droplet generator supplies the target droplet.

11. The lithography system of claim 8, where the at least one parameter comprises a speed of the target droplet.

12. A method for generating EUV radiation, comprising:
generating a target droplet with a target droplet generator;
recording an image of the target droplet on a first image plane to detect a first position of the target droplet;
recording an image of the target droplet on a second image plane to detect a second position of the target droplet;
projecting a laser pulse onto the target droplet when the target droplet is located on a focus plane;
calculating a displacement of the target droplet on the focus plane according to a difference between the first position and the second position; and
adjusting at least one parameter of the target droplet generator according to the displacement of the target droplet on the focus plane.

13. The method for generating EUV radiation as claimed in claim 12, wherein the calculating comprises calculating a displacement of the target droplet in a y-axis direction on the focus plane according to a difference between the first position in the y-axis direction and the second position in the y-axis direction, and calculating a displacement of the target droplet in a z-axis direction on the focus plane according to a difference between the first position in the z-axis direction and the second position in the z-axis direction,
wherein the y-axis direction and the z-axis direction are perpendicular to an x-direction along which the first image plane, the second image plane, and the focus plane are arranged,
wherein the parameter of the target droplet generator is adjusted according to the displacement of the target droplet in the y-axis direction on the focus plane and the displacement of the target droplet in the z-axis direction on the focus plane.

14. The method for generating EUV radiation as claimed in claim 13, wherein the image of the target droplet on the first image plane and the image of the target droplet on the second image plane are imaged by a first camera and a second camera, respectively, wherein both the first image plane and the second image plane are perpendicular to the x-axis direction and parallel to a y-z plane.

15. The method for generating EUV radiation as claimed in claim 12, wherein the first image plane is located about 10 mm away from the focus plane.

16. The method for generating EUV radiation as claimed in claim 12, wherein the at least one parameter comprises the position where the target droplet generator supplies the target droplet.

17. The method for generating EUV radiation as claimed in claim 12, wherein the at least one parameter comprises the flow velocity of the target droplet.

18. The method for generating EUV radiation as claimed in claim 12, further comprising projecting another laser pulse onto the target droplet at a lighting position, wherein the lighting position is located between the second image plane and the focus plane.

19. The method for generating EUV radiation as claimed in claim 12, further comprising calculating the displacement of the target droplet on the focus plane according to the difference between the first position and the second position and a speed of the target droplet.

20. The method for generating EUV radiation as claimed in claim 12, further comprising after the adjustment of the at least one parameter of the target droplet generator, projecting another laser pulse onto another target droplet generated by the target droplet generator when the another target droplet is located on the focus plane.

* * * * *